United States Patent
Koole et al.

(10) Patent No.: US 9,011,978 B2
(45) Date of Patent: Apr. 21, 2015

(54) METHOD AND APPARATUS FOR TREATMENT OF SELF-ASSEMBLABLE POLYMER LAYERS FOR USE IN LITHOGRAPHY

(75) Inventors: Roelof Koole, Eindhoven (NL); Vadim Yevgenyevich Banine, Deurne (NL); Sander Frederik Wuister, Eindhoven (NL); Emiel Peeters, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 107 days.

(21) Appl. No.: 13/580,356

(22) PCT Filed: Jan. 6, 2011

(86) PCT No.: PCT/EP2011/050126
§ 371 (c)(1),
(2), (4) Date: Aug. 21, 2012

(87) PCT Pub. No.: WO2011/104045
PCT Pub. Date: Sep. 1, 2011

(65) Prior Publication Data
US 2012/0312501 A1  Dec. 13, 2012

Related U.S. Application Data

(60) Provisional application No. 61/308,773, filed on Feb. 26, 2010.

(51) Int. Cl.
*B05D 3/02*   (2006.01)
*G03F 7/00*   (2006.01)
*B82Y 10/00*  (2011.01)
*B82Y 40/00*  (2011.01)

(52) U.S. Cl.
CPC ............... *G03F 7/0002* (2013.01); *B82Y 10/00* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 2,075,385 A | | 3/1937 | Wallis et al. |
| 3,725,026 A | | 4/1973 | Roetter et al. |
| 4,913,718 A | | 4/1990 | Yoshimura et al. |
| 7,118,784 B1 | * | 10/2006 | Xie ........................ 427/346 |
| 7,521,094 B1 | | 4/2009 | Cheng et al. |
| 2006/0013956 A1 | * | 1/2006 | Angelescu et al. ........... 427/331 |
| 2008/0217292 A1 | | 9/2008 | Millward et al. |
| 2008/0260941 A1 | * | 10/2008 | Jin ........................ 427/126.4 |
| 2009/0062470 A1 | | 3/2009 | Millward et al. |
| 2009/0236309 A1 | | 9/2009 | Millward et al. |

(Continued)

FOREIGN PATENT DOCUMENTS

WO    2009/134635    11/2009

OTHER PUBLICATIONS

Hashimoto et al, Macromolecules 32, pp. 952-954, 1999.*

(Continued)

*Primary Examiner* — Erma Cameron
(74) *Attorney, Agent, or Firm* — Pillsbury Winthrop Shaw Pittman LLP

(57) ABSTRACT

Treatment of a layer comprising self-assemblable polymer at a surface of a substrate is disclosed. In an embodiment, the treatment includes arranging a zone of temperature change to sweep across the layer, wherein a temperature of the layer within the zone differs from an initial temperature of the layer prior to passage of the zone.

20 Claims, 4 Drawing Sheets

(56) References Cited

U.S. PATENT DOCUMENTS

2009/0240001 A1* 9/2009 Regner ............................ 525/95
2014/0205752 A1* 7/2014 Millward et al. ............. 427/256

OTHER PUBLICATIONS

Bodycomb et al, Macromolecules 32, pp. 2075-2077, 1999.*
Brian C. Berry et al., "Orientational Order in Block Copolymer Films Zone Annealed below the Order-Disorder Transition Temperature," Nano Lett., vol. 7, No. 9, pp. 2789-2794 (2007).
International Search Report mailed Aug. 2, 2011 in corresponding International Patent Application No. PCT/EP2011/050126.
Miri Park et al., "Block Copolymer Lithography: Periodic Arrays of~$10^{11}$ Holes in 1 Square Centimeter," Science, vol. 276, pp. 1401-1404 (May 30, 1997).
XiaoMin Yang et al., "Directed Block Copolymer Assembly versus Electron Beam Lithography for Bit-Patterned Media with Areal Density of 1 Terabit/$inch^2$ and Beyond," ACS Nano, vol. 3, No. 7, pp. 1844-1858 (2009).

* cited by examiner

METHOD AND APPARATUS FOR TREATMENT OF SELF-ASSEMBLABLE POLYMER LAYERS FOR USE IN LITHOGRAPHY

This application is the United States national phase entry of PCT patent application no. PCT/EP2011/050126, filed Jan. 6, 2011 (published as PCT patent application publication no. WO 2011/104045), which claims the benefit under 35 USC §119(e) of U.S. provisional patent application No. 61/308,773, filed on Feb. 26, 2010, the contents of each of the foregoing documents incorporated herein in its entirety by reference.

FIELD

The present invention relates to an apparatus and method for manufacture of devices by lithography. The invention relates to a method for reduction of defects in a resist layer, particularly a resist layer of self-assembled block copolymers.

BACKGROUND

In lithography for device manufacture, there is an ongoing desire to reduce the size of features in a lithographic pattern in order to increase the density of features on a given substrate area. Patterns of smaller features having critical dimension (CD) at a nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, and chemical resists may be used to achieve this.

SUMMARY

The use of self-assembly of block copolymers (BCPs) is a potential method for improving the resolution to better values than those obtainable by prior art lithography methods or as an alternative to electron beam lithography for preparation of imprint templates.

Self-assemblable block copolymers are materials useful in nanofabrication because they may undergo an order-disorder transition on cooling below a certain temperature (order-disorder transition temperature To/d) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification the chemical compositions of the blocks of the copolymers.

The feasibility of using thin films of block copolymers as templates was demonstrated by Chaikin and Register, et al., Science 276, 1401 (1997). Dense arrays of dots and holes with dimensions of 20 nm were transferred from a thin film of poly(styrene-b-isoprene) to silicon nitride substrates.

Block copolymers comprise different blocks of identical monomers arranged side-by side along the polymer chain. Each block may contain many monomers of its respective type. So, for instance, an A-B block copolymer may have a plurality of type A monomers in each A block and a plurality of type B monomers in each B block. An example of a suitable block copolymer is, for instance, a polymer having alternating blocks of polystyrene monomers (hydrophobic block) and polymethylmethacrylate (PMMA) monomers (hydrophilic block). Other block copolymers with blocks of differing hydrophobicity/hydrophilicity may be useful. For instance triblock copolymers may be useful. The blocks are connected to each other by covalent links in a linear or branched fashion (e.g. star-configuration).

Block copolymers may form many different phases upon self-assembly, dependent upon the volume fractions of the blocks, degree of polymerization within each block type (i.e. number of monomers of each respective type within each respective block), and/or the optional use of solvents and surface interactions. When applied in thin films, geometric confinement may pose additional boundary conditions that may limit the numbers of phases. In general only spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

The self-assembled block copolymer phases may orient with symmetry axes parallel or perpendicular to the substrate and lamellar and cylindrical phases tend to be most interesting for lithography applications, as they may form line and spacer patterns and hole arrays, respectively, and may provide good contrast when one of the domain types is subsequently etched.

Two methods used to guide self-assembly of block copolymers onto surfaces are graphoepitaxy and chemical pre-patterning. In the graphoepitaxy method, self-organization of block copolymers is guided by topological pre-patterning of the substrate. Self-aligned block copolymers can form parallel linear patterns with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is hydrophilic in nature. Resolution may be improved over the resolution of the patterned substrate by the block copolymer patterns subdividing the spacings of pre-patterns on the substrate.

In the chemical pre-patterning method, the self-assembly of block copolymer domains is guided by chemical patterns on the substrate. Chemical affinity between the chemical patterns and at least one of the types of copolymer blocks within the polymer chain may result in the precise placement of one of the domain types onto a corresponding region of the chemical pattern on the substrate. For instance if the block copolymer is a di-block copolymer with A and B blocks, where A is hydrophilic and B is hydrophobic in nature, and the chemical pattern comprises hydrophobic regions on a hydrophilic surface, the B domains may preferentially assemble onto the hydrophobic regions. As with the graphoepitaxy method of alignment, the resolution may be improved over the resolution of the patterned substrate by the block copolymer patterns subdividing the spacings of the pre-patterned features on the substrate (so-called density multiplication). Chemical pre-patterning is not limited to linear pre-patterns; for instance the pre-pattern may be in the form of a 2-D array of dots suitable as a pattern for use with a cylindrical phase-forming block copolymer. Graphoepitaxy and chemical pre-patterning may be used to guide the self-organization of lamellar, cylindrical phases.

In a typical process to implement the use of block copolymer self assembly in nanofabrication, a substrate may be modified with an orientation control layer to induce the preferred orientation of the self-assembly pattern in relation to the substrate. For most block copolymers there is a preferential interaction between one of the blocks and the substrate surface that may result in orientation. For instance, for a polystyrene/PMMA block copolymer, the PMMA block will preferentially wet oxide surfaces and this may be used to induce PMMA domains to lie oriented parallel to the plane of the surface. Perpendicular orientation may be induced by rendering the substrate surface neutral to both blocks such that both blocks wet the surface equally well. A neutral surface can be created by use of random copolymer brushes which are covalently linked to the surface by a hydroxyl terminal group. Alternatively or additionally, crosslinkable random copolymers or appropriate silanes can be used to render a surface neutral.

The substrate may be further provided with a topological or chemical pre-pattern as set out above to guide the self-assembly pattern. A thin layer of self-assemblable block copolymer is typically deposited on the substrate. A suitable method for deposition is spin coating as it is capable of providing a well defined, uniform, thin layer. A suitable layer thickness for a deposited block copolymer film is approximately 20 to 100 nm. Following deposition of the block copolymer film, the film may still be disordered or only partially ordered and additional steps may be needed to promote and/or complete self-assembly.

The block copolymers are self-assembled into a highly ordered regular pattern. The self-assembly process occurs at a temperature above the glass-transition temperature and below the order-disorder temperature for the block copolymer. This stage is referred to as ordering, and is generally achieved by uniform heating. The self-assembly process may nucleate at multiple points in the block copolymer film and this may result in the formation of defects.

Defects formed during ordering as set out above may be partly removed by annihilation. Defects such as disclinations (which are line defects in which rotational symmetry is violated, e.g. where there is a defect in the orientation of a director) may be annihilated by pairing with other defects or disclinations of opposite sign. Chain mobility of the block copolymer may be a significant factor for determining defect migration and annihilation and so annealing may be carried out at a temperature where chain mobility is high but the self-assembled ordered pattern is not lost. This implies a temperature up to a few ° C. above or below the order/disorder temperature To/d. Unfortunately, some isolated defects are hard to annihilate. They have a high immobility which may be attributable to high energy input required to restructure the ordered surroundings of such defects.

The ordering and defect annihilation may be combined into a single annealing process.

Although the techniques set out above for applying block copolymer self-assembled layers to surfaces provide partial alignment of the block copolymer structure on a surface, the resulting self-assembled layers may have high levels of incorrectly aligned polymer molecules, leading to defects in the resulting self-assembled layer.

Layers of self-assembled block copolymers, after directed ordering and defect reduction through annealing, may exhibit a defect rate of 1 in $10^3$ to 1 in $10^4$, expressed as the number of non-functional features of a multi-component device derived from the self-assembled layer (see, for example, Yang et. al, ACS Nano, 2009, 3, 1844-1858).

Self-assembly of block copolymers is a process where the assembly of many small components (the block copolymers) result in the formation of larger more complex structures (the nanometer sized features in the self-assembly pattern) and the defects arise naturally from the physics controlling the self assembly of the polymers. Self-assembly is driven by the differences in interactions between A-A, B-B and A-B blocks of an A-B block copolymer, with the driving force for phase separation described by Flory-Huggins theory for the system under consideration.

For block copolymers which undergo self-assembly, the block copolymer will exhibit an order-disorder temperature To/d. If layer formation takes place below this temperature, the molecules will be driven to self-assemble. Above the temperature To/d, a disordered layer will be formed with the entropy contribution from disordered A/B domains outweighing the enthalpy contribution arising from favorable interactions between neighboring A-A and B-B blocks in the layer. The block copolymer may also exhibit a glass transition temperature Tg below which the polymer is effectively immobilized and above which the copolymer molecules may still reorient within a layer relative to neighboring copolymer molecules. If To/d is less than Tg for the block copolymer, then a self-assembled layer will be unlikely to form or will be highly defected because of the inability of the molecules to align correctly when below To/d and below Tg. A desirable block copolymer for self assembly has To/d higher than Tg. However, once the molecules have assembled into a solid-like layer, even when annealed at a temperature above Tg but below To/d, the mobility of the polymer molecules may be insufficient to provide adequate defect removal by annealing. Multiple annealing may be carried out to give improvements in defect levels, but this may take considerable time.

Another option is to anneal the layer just above To/d to provide sufficient mobility to the polymer molecules to remove defects. However, annealing at a temperature far above To/d or for a too long period may result in disordering of the film. Annealing above To/d may involve sequential temperature cycles just above and below To/d, for instance up to a few ° C., such as 5° C., above or below To/d.

Thus, it is desirable to provide a method and apparatus which tackles defect levels for self-assembled block copolymer layers, for example a method and apparatus which allow for improvement in defect levels and/or which provide reduction in defect levels in shorter time, and/or which allow for formation of self assembled polymer layers containing low defect levels.

It is desirable, for example, to provide an apparatus and method useful for providing self-assembled layers of block copolymers, suitable for use in device lithography, which have low defect levels. It is desirable, for example, to provide an apparatus and method for reducing defect levels in self-assembled layers.

According to an aspect of the invention, there is provides a method for treatment of a layer comprising self-assemblable polymer at a surface of a substrate, the method comprising arranging for a zone of temperature change to sweep across the layer, wherein a temperature of the layer within the zone differs from an initial temperature of the layer prior to passage of the zone.

The following features are applicable to all the various aspects of the methods and apparatuses herein where appropriate. When suitable, combinations of the following features may be employed as part of the methods and apparatuses herein, for instance as set out in the claims. The methods and apparatuses herein are particularly suitable for use in device lithography. For instance, a method and apparatus herein may be used for treatment or formation of a resist layer of self-assembled polymer for use in patterning a device substrate directly or for use in patterning an imprint template for imprint lithography.

"A temperature within the zone" includes temperatures within the zone, which will be of finite extent, and the temperature within the zone may or may not be uniform across the extent of the zone.

The size (e.g. surface area or width) of the zone may be considerably less than the size of the layer across which the zone is arranged to sweep, or it may be similar or even greater in size than the size of the substrate.

The self-assemblable polymer layer may be a layer deposited, for instance, by spin-coating onto the substrate.

The method may be a method for ordering or for annealing of the self-assemblable polymer layer.

The method is applicable to a layer of self-assemblable polymer already present on the surface. Hence, the self-assemblable polymer layer is a deposited layer of self-assemblable polymer at the surface. In other words, the method may be used for ordering and/or annealing an already existing layer of self-assemblable polymer which is present as a solid or solid-like layer on a surface of a substrate.

In this specification, the term layer includes a portion of the layer, and the method may be applied to a portion of the layer additionally or alternatively to the entire layer.

The layer may have an initial temperature Ti before passage of the zone and the zone may have a temperature profile across the width of the zone whereby temperatures of the layer within the zone differ from the initial temperature Ti. The layer may have a final temperature Tf after passage of the zone.

The method may comprise returning the layer from its final temperature Tf to its initial temperature Ti after arranging for a zone of temperature change to sweep across the layer and subsequently repeating the arranging for a zone of temperature change to sweep across the layer. This repetition may be repeated as many times as necessary. Tf and Ti may be substantially the same.

The zone may progress in a sweep direction along which is measured a width of the zone, and the temperature profile may be substantially uniform across the width of the zone whereby the layer within the zone has a temperature Tz. However, the temperature profile may be non-uniform. For instance the temperature may change monotonically from Ti to Tf across the width of the zone, or there may be regions in the zone where the temperature is lower than Ti alongside regions where the temperature is higher than Ti.

The self-assemblable polymer may have an order-disorder transition temperature To/d and Ti may be less than To/d. Tf may be less than To/d.

The self-assemblable polymer may have a glass transition temperature Tg and a temperature within the zone may exceed Tg. A temperature within the zone may exceed To/d. The glass transition temperature is suitably measured by differential scanning calorimetry (DSC). Ti may be less than Tg.

The zone may be a substantially linear or annular strip. The zone may sweep across the layer in a direction substantially normal to the strip's length or perimeter respectively to the strip's length or perimeter for a linear strip or an annular strip, respectively. The zone may be an annular strip and the zone may sweep in a direction extending radially inwards or outwards from a central locus. For instance the zone may be a circular annular strip around a center point as central locus.

In one arrangement, the substrate may be arranged to move from a first region having a temperature Ti into a second region having a temperature Tf through an intermediate region arranged to provide the temperature profile of the zone, the zone sweeping across the substrate as the substrate passes through the intermediate region. The first and second regions may be chambers arranged to provide temperatures Ti and Tf respectively at the layer. The substrate may, for instance, be carried through the chambers, passing through windows or apertures between the chambers, on a substrate holder carried by a conveyor, such as a conveyor belt or some other suitable conveying device. The intermediate region may simply be the interface between the two regions or chambers, or the intermediate region may be an intermediate chamber arranged to provide a controlled intermediate temperature Tz at the layer. For instance the chambers may be ovens or refrigerators arranged to be controlled at preset temperatures.

In a further arrangement, the substrate may be located on a substrate holder comprising an array of individually controllable heating and/or cooling elements arranged to provide the zone of temperature change. With this arrangement, the substrate may be positioned in a chamber, such as an oven or refrigerator, arranged to provide a temperature Ti at the layer.

In a further arrangement, the zone of temperature change may be provided by localized application of heating or cooling to the layer by a heating or cooling source directed at the layer. For instance, the heating and/or cooling source may be a jet of gas directed at the layer. Alternatively or additionally, the heating source may be a beam of electromagnetic radiation directed at the layer, for instance a laser beam, focused infra-red radiation, or the like. Also with this arrangement, the substrate may be positioned in a chamber, such as an oven or refrigerator, arranged to provide a temperature Ti at the layer.

According to an aspect, there is provided a method for treatment of a layer at a surface of a substrate, the method comprising sequential heating and/or cooling of adjacent parts of the layer from an initial temperature, whereby a zone of temperature change is caused to sweep across at least a portion of the layer.

By adjacent parts are meant parts of the layer which are smaller than the portion of the layer across which the zone is caused to sweep. Typically, the width of the parts sequentially heated or cooled such that they differ from Ti will define the width of the zone. So, for example, a portion of the layer of width W may be thought of as having say 10 adjacent stripes, each of width W/10 as the adjacent parts, numbered 1 to 10. First, stripe 1 is heated to Tz with stripes 2 to 10 remaining at Ti, then stripe 2 is heated to Tz with stripes 3 to 10 remaining at Ti. This is continued across the portion of the layer until the entire layer is at Tz. In this example Tz and Tf are the same. Tz may vary across the zone According to an aspect, there is provided a method for ordering and/or annealing of a self-assemblable polymer layer at a surface of a substrate, the method comprising sequential heating or cooling of adjacent parts of the layer from an initial temperature, whereby a zone of temperature change is caused to sweep across at least a portion of the layer.

According to an aspect, there is provided an apparatus comprising a substrate holder to hold a substrate having a layer at a surface, the apparatus arranged to provide a zone of temperature change at the layer and to sweep the zone across at least a portion of the layer, wherein the zone has a temperature profile across the width of the zone such that a temperature of the layer within the zone differs from an initial temperature for the layer within the zone prior to passage of the zone.

In a suitable arrangement, the apparatus may comprise a first chamber arranged to provide an initial temperature Ti at the layer, a second chamber arranged to provide a temperature Tf at the layer and an intermediate region between the first and second chambers, with apertures between respective chambers arranged to permit passage of the substrate holder between the chambers through the intermediate region, and a conveyor arranged to move the substrate holder from a locus in the first chamber to a locus in the second chamber through the intermediate region, wherein the intermediate region is arranged to provide the zone of temperature change as the substrate holder carries the substrate therethrough.

The intermediate region may simply be the junction between the first and second chambers, when Ti and Tf differ in value, or may be an intermediate chamber positioned between the first and second chambers and arranged to provide a temperature Tz at the layer.

In a further suitable arrangement, the substrate holder may be arranged to hold the substrate positioned in a chamber arranged to provide the temperature Ti at the layer and may further comprise a heating and/or cooling device arranged to provide the zone of temperature change. The heating and/or cooling device may be a nozzle configured to direct a jet of gas directed onto the layer of the substrate during use, or for instance may be an outlet for a beam of electromagnetic radiation, such as a laser or focused infra-red source, directed onto the substrate during use.

In a further suitable arrangement, the substrate holder may be configured to hold the substrate positioned in a chamber arranged to provide the temperature Ti at the layer and the heating and/or cooling device arranged to provide the zone of temperature change may comprise an array of individually operable heating and/or cooling members arranged to be in thermal contact with the substrate and arranged to provide the heating and/or cooling. For instance the heating and/or cooling elements may be positioned within the substrate holder and arranged to be in thermal contact with the substrate.

According to an aspect, there is provided a lithography method for patterning a substrate surface by resist etching, wherein the method comprises treating a resist layer of self-assemblable polymer by the methods described above.

According to an aspect, there is provided a lithography apparatus for patterning a substrate surface by etching of a resist layer incorporating the apparatus described above.

BRIEF DESCRIPTION OF THE DRAWINGS

Specific embodiments of the invention will be described with reference to the accompanying figures, in which.

DETAILED DESCRIPTION

Figure 1A:
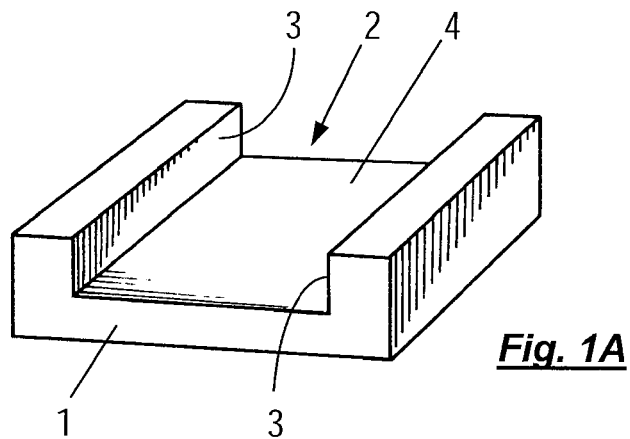
FIGS. 1A to 1C schematically depict directed self-assembly of A-B block copolymers onto a substrate by graphoepitaxy and formation of relief patterns by selective etching of one domain.
Figure 1B:
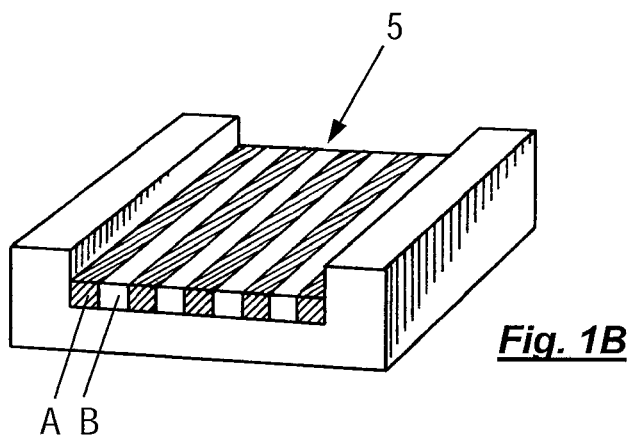
Figure 1C:
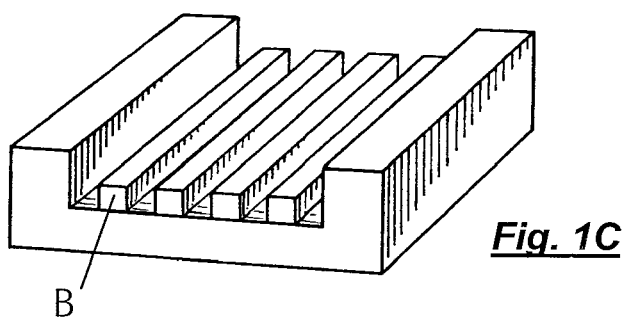

FIG. 1A shows a substrate 1 with a trench 2 formed therein bounded by side walls 3 and a bottom surface 4. In FIG. 1B, a self-assemblable A-B block copolymer with hydrophilic A blocks and hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the side walls 3, which are also hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. The pitch of the self-assembled polymer structure 5 and the width of the trench 4 are arranged so that a number of alternating stripes of domains can fit into the trench between the sidewalls with a type A domain against each side wall.

Figure 2A:
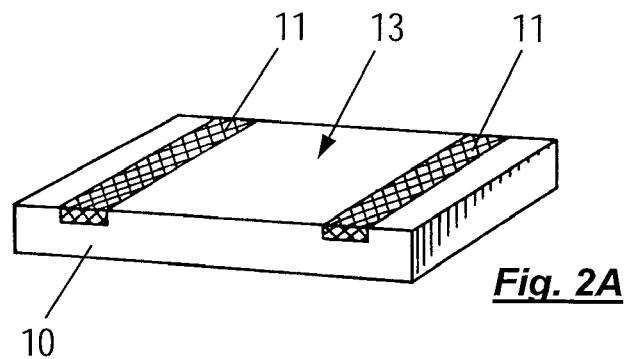
FIGS. 2A to 2C schematically depict directed self-assembly of A-B block copolymers onto a substrate by chemical pre-patterning and formation of relief patterns by selective etching of one domain.
Figure 2B:
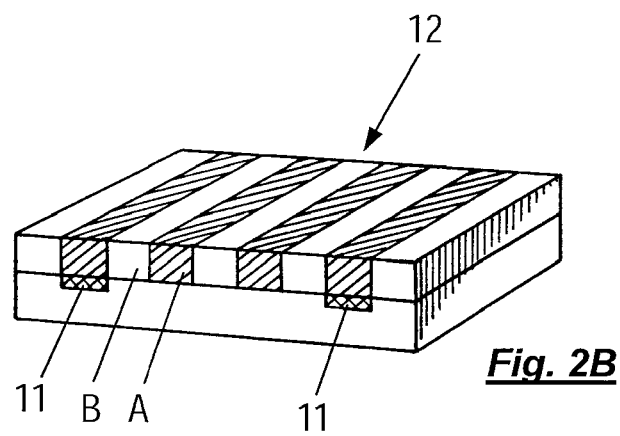
Figure 2C:
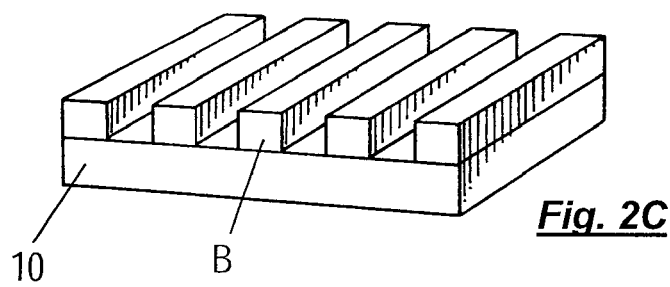

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with hydrophilic A blocks and hydrophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A hydrophilic domains have nucleated atop the pinning stripes 11, which are also hydrophilic. In FIG. 1C, the type A domains have been removed by selective chemical etching, leaving the type B domains to form a relief pattern on the surface 13 where they may serve as a template for subsequent patterning of surface 13, for instance by further chemical etching. The pitch of the self-assembled polymer structure 12 and the spacings of the pinning stripes 11 are arranged so that a number of alternating stripes of domains can fit between the pinning stripes 11 with a type A domain atop each pinning stripe 11.

Figure 3:
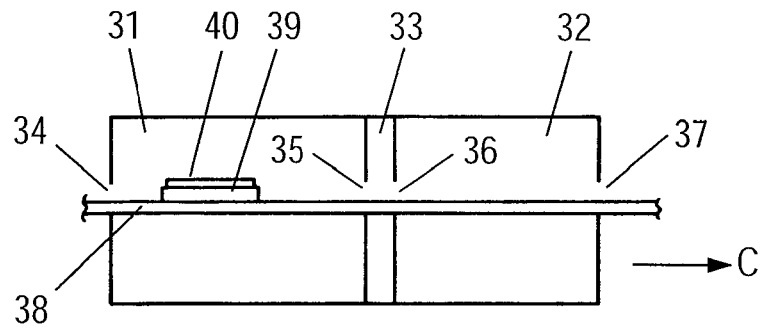
FIG. 3 shows a schematic side cross-sectional depiction of an apparatus according to an embodiment of the invention.

FIG. 3 depicts a cross-sectional view through an apparatus according to an embodiment of the invention. The apparatus has two heating chambers or ovens 31, 32 each arranged to be substantially isothermal within each chamber, with an intermediate heating chamber 33 located between the chambers 31 and 32. Apertures 34, 35, 36, 37 are located at the boundaries of the chambers to permit a conveyor belt 38 to carry a substrate holder 39 upon which a substrate 40 is carried. The substrate 40 has a layer of self-assemblable polymer on its upper surface (not shown). The first chamber 31 may be held at an initial temperature Ti with the second chamber 32 held at a final temperature Tf. The intermediate chamber 33 may be held at a temperature Tz which is different from Ti. As the substrate 40 is gradually conveyed through the apertures 34, 35, 36, 37 on the conveyor belt 38, the layer on the substrate will first equilibrate to temperature Ti in first chamber 31. As the substrate passes through the aperture 35 into intermediate chamber 33, the section of substrate and layer inside intermediate chamber 33 will equilibrate towards temperature Tz while the section is inside intermediate chamber 33 then the section will equilibrate to Tf when it reaches second chamber 32 through aperture 36.

As the substrate and layer move in direction C through apertures 35 and 36 as shown in FIG. 3, the result is that a zone at temperature Tz will sweep across the substrate 40 and layer in the direction opposite to C, the width of the zone being defined by the width of the gap between apertures 35, 36, with the initial temperature prior to passage of the zone being Ti and the final temperature immediately after passage of the zone being Tf. The substrate may, for instance, be held stationary in first chamber to equilibrate to Ti, moved through apertures 35, 36 to sweep the zone of temperature Tz across the substrate, then held stationary again in second chamber 32 to equilibrate to Tf.

Figure 4A:
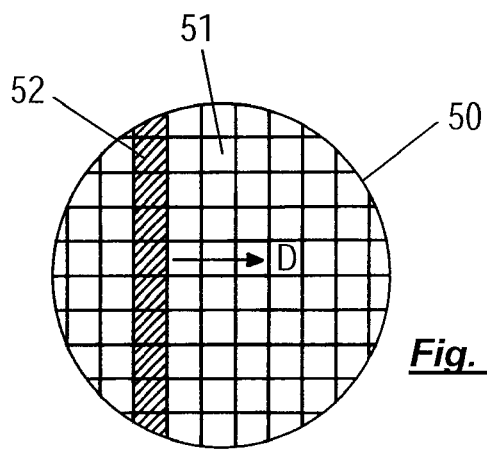
FIGS. 4A and 4B schematically depict a plan view of a substrate holder suitable for use in an embodiment of the invention.
Figure 4B:
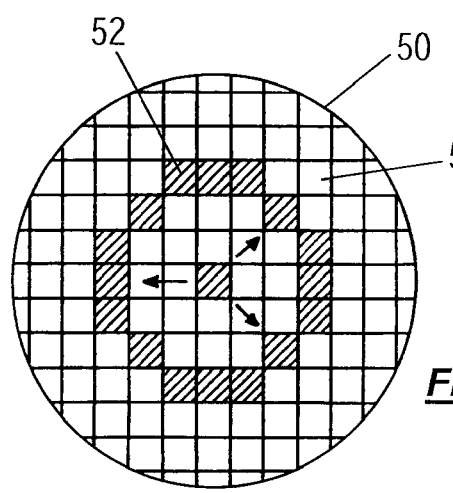

FIGS. 4A and 4B depict plan views of a substrate holder suitable for use in an embodiment of the invention. The substrate holder 50 is a table composed of an array of individually controllable heating elements 51, 52. The temperature of each element is individually controllable through a controller, such as a microprocessor driven controller running a computer program. In the Figures, heating elements 52 which are heated to an increased temperature Tz are indicated by hatching. The other elements 51 remain unheated and so are at the same temperature as the surroundings in which the substrate holder is positioned or are heated to a particular temperature other than Tz.

In use, the substrate holder 50 may be held in a chamber (not shown) having its internal temperature controlled at Ti with a substrate and layer (not shown) positioned on the substrate holder 50. The controller is suitably programmed to heat some of the array of heating elements 52 to a temperature Tz while leaving others 51 at Ti. The result is that the heated elements heat the substrate and layer placed upon them, by conduction, to form a heated zone of temperature Tz (or a little less than Tz depending upon the ambient temperature within the chamber) at the layer. The controller may be programmed to cause a zone of temperature Tz to sweep across the substrate holder. In FIG. 4A, the zone is a linear zone composed of a single column of heated elements, caused to sweep across the substrate holder in direction D by the elements in adjacent columns being heated sequentially. In FIG. 4B, the controller is programmed to cause an approximately circular annular zone to sweep outwards from the center of the substrate holder. The heating elements may be alternatively or additionally cooling elements, for instance each may be provided with an individually controllable Peltier cooler. The width of the zone may be limited by the width of the elements, so this may be a small as possible, say less than 1 mm, desirably less than 500 micrometers.

As indicated in FIG. 4B, more than one zone may be sweeping across the substrate holder at any time. Although the zone is shown sweeping outwards from a central point in FIG. 4B, it may, instead, be configured to move to converge inwards to the center of the substrate holder. The elements may be controlled so that after passage of the zone of temperature Tz, the elements remain at a temperature Tf rather than returning to Ti, the initial temperature.

Figure 5:
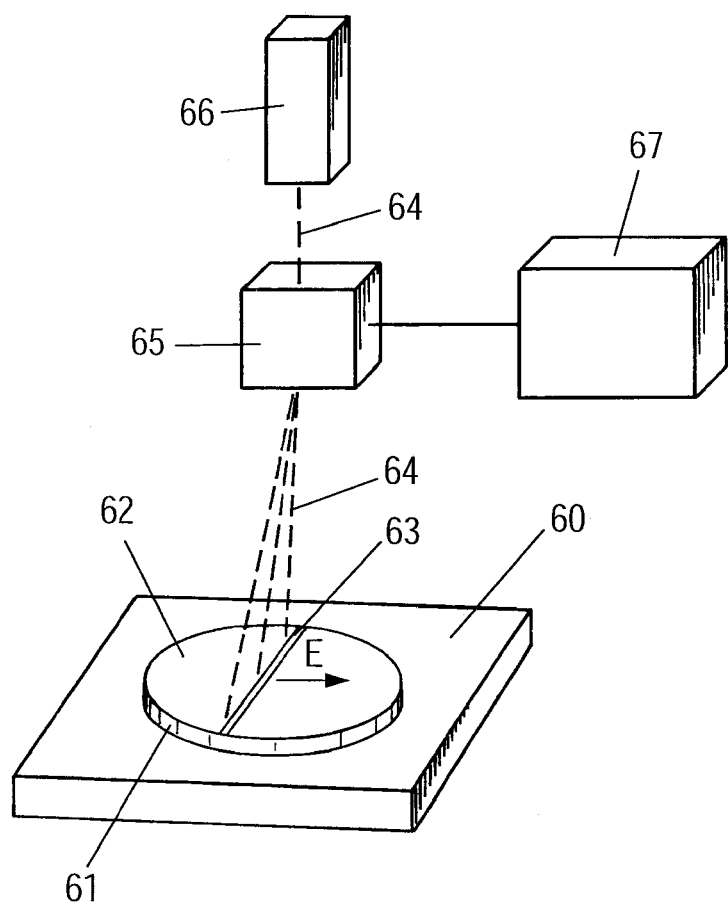
FIG. 5 shows a schematic perspective view of an embodiment of the invention.

FIG. 5 shows an apparatus according to a further embodiment of the invention. A substrate holder 60 carries a substrate 61 having a layer of self-assemblable polymer 62 on its upper surface. The substrate holder, substrate and layer are held initially at temperature Ti in a thermally controlled chamber in which they are located (not shown). A zone of increased temperature 63 is caused to sweep across the layer 62 in direction E, the zone having a temperature Tz. The zone of increased temperature Tz is caused by a laser beam 64 from a laser source 66 which is targeted onto the layer 62 by a beam deflector 65 controlled by a controller 67 to move back and forth along the zone 63 to provide substantially uniform heating of the layer 62 within the zone 63. In an embodiment, the beam may have the width of the substrate 61 or layer 62 and so the beam need to go back and forth along zone 63. The beam deflector 65 will typically include an arrangement of movable mirrors and/or lenses controllable to direct the laser beam 64. The controller may be arranged to direct the laser beam 64 so that the zone 63 slowly sweeps across the layer 62, with the layer returning to temperature Ti following passage of the zone as the layer 62 equilibrates with the surrounding chamber temperature.

For instance, in the examples described above, where Tf and Ti differ, in order to carry out ordering of a solid-like self-assemblable layer of polymer in an initially disordered state on a substrate, Ti may be less than To/d, the order/disorder transition temperature of the polymer, for instance up to 20° C. less, up to 10° C. less, up to 5° C. less or up to 1° C. less. Tz may be greater than Tg and less than To/d for the polymer, for instance up to 1° C. less than To/d. Tf may be considerably less than Tg, for instance up to 20° C. less, up to 50° C. less, up to 100° C. less or up to 200° C. less, in order to freeze the polymer structure into the ordered configuration achieved by passage of the zone across the sample. The width of the zone and the speed at which the substrate passes through the zone may be adjusted for optimal results. For instance, the width of the zone may be as wide as, or even wider than, the entire substrate, or it may be only a few micrometers or less in width. The speed at which the substrate passes through the zone may be, for instance, from 5 micrometers per second to 5 cm per second, say 100 micrometers per second to 5 mm per second. In another example, temperatures may be as described as above except that Tz may be greater than To/d for the polymer, for instance up to 1° C. or say up to 5° C. or up to 10° C. greater than To/d. To/d may be expressed as a range of temperature rather than a specific temperature, for example due to hysteresis effects or because of the thermodynamic nature of the transition, in which case references to temperatures less than To/d are to temperatures relative to the bottom of the range and references to temperatures greater than To/d are to temperatures relative to the top of the range.

To/d may be measured by any suitable technique for assessing the ordered/disordered state of the polymer, such as differential scanning calorimetry (DSC).

For annealing of defects in an already-deposited layer of self-assembled polymer, Ti may be less than To/d, for instance up to 5° C. or less than To/d or up to 10° C. less, with Tz greater than To/d, for instance up to 5° C. or up to 10° C. or more greater than To/d with Tf either less than To/d and greater than Tg (e.g. up to 5° C. or up to 10° C. less than To/d), or less than To/d and less than Tg for the polymer (e.g. up to 10° C. or up to 20° C. or more below Tg) in order to freeze the annealed polymer structure. As for some of the examples, Tf and Ti may have substantially the same value or they may differ.

It may be useful to apply the method of treatment to only a portion of a layer or substrate rather than subjecting an entire substrate or layer to treatment. In this specification, the term "layer" includes the meaning "portion of layer". Only a portion of the substrate may be provided with a layer of self-assemblable polymer. It may be that the range of size over which the treatment is effective is smaller than the overall size of a layer or a substrate carrying a layer of self-assemblable polymer to which the treatment is to be applied, in which case the treatment may be applied to portions of the layer, perhaps sequentially.

By these methods, defects, such as disclinations, may move along with the zone as it sweeps across the substrate, so that defects may concentrate at the edges of the layer on the substrate, remote from portions of the layer to be used for subsequent processing to form devices.

For ordering the polymer layer, an embodiment of the invention provides the capacity for nucleation in the self assembly process to be initiated from the zone's starting point as it is swept across a portion of the layer, potentially from a single point or locus, so that the ordered self-assembled pattern may grow out following the path of the zone's movement as it is swept across the portion of layer. This may result in a structure with significantly reduced number of isolated defects that are otherwise formed at disclinations or domain boundaries.

The sweeping of the zone may give direction to migration of defects. In this way defects may become pinned to the zone and hence carried towards areas where they are less critical. For instance defects may be swept to a specific point where the increased local defect concentration will increase the chance of pairing and mutual annihilation, for instance of disclinations.

If the direction of sweep of the zone is in the same direction as the axis along which the polymer molecule lies, when aligned by graphoepitaxy or chemical pre-patterning as set out hereinbefore, then defects arising from polymer misalignment may be reduced.

In an embodiment, there is provided a method for treatment of a layer comprising self-assemblable polymer at a surface of a substrate, the method comprising arranging for a zone of temperature change to sweep across the layer, wherein a temperature of the layer within the zone differs from an initial temperature of the layer prior to passage of the zone.

In an embodiment, the method is for ordering or annealing of the layer. In an embodiment, the layer has an initial temperature $T_i$ before passage of the zone and wherein the zone has a temperature profile across the width of the zone such that a temperature of the layer within the zone differs from the initial temperature $T_i$. In an embodiment, the layer has a final temperature $T_f$ after passage of the zone. In an embodiment, the method comprises returning the layer from its final temperature $T_f$ to its initial temperature $T_i$ after the arranging for a zone of temperature change to sweep across the layer, and subsequently repeating the arranging for a zone of temperature change to sweep across the layer. In an embodiment, $T_f$ and $T_i$ are substantially the same. In an embodiment, the self-assemblable polymer has an order-disorder transition temperature $T_{o/d}$ and wherein $T_i$ is less than $T_{o/d}$. In an embodiment, the self-assemblable polymer has an order-disorder transition temperature $T_{o/d}$ and wherein $T_f$ is less than $T_{o/d}$. In an embodiment, the zone progresses in a sweep direction along which is measured a width of the zone, and the temperature profile is substantially uniform across the width of the zone, such that the layer within the zone has a temperature $T_z$. In an embodiment, the self-assemblable polymer has a glass transition temperature $T_g$ and a temperature within the zone exceeds $T_g$. In an embodiment, a temperature within the zone exceeds an order-disorder transition temperature $T_{o/d}$ of the self-assemblable polymer. In an embodiment, an initial temperature $T_i$ of the layer before passage of the zone is less than $T_g$. In an embodiment, the zone is a substantially linear or annular strip and the zone sweeps across at least a portion of the layer in a direction substantially normal to the strip's length or perimeter respectively. In an embodiment, the zone is an annular strip and the zone sweeps in a direction extending radially inwards to or outwards from a central locus. In an embodiment, the substrate is arranged to move from a first region having a temperature $T_i$ into a second region having a temperature $T_f$ through an intermediate region arranged to provide the temperature profile of the zone, the zone sweeping across the layer as the substrate passes through the intermediate region. In an embodiment, the first and second regions are chambers arranged to provide temperatures $T_i$ and $T_f$ respectively at the layer. In an embodiment, the intermediate region is a chamber arranged to provide a controlled intermediate temperature $T_z$ at the layer. In an embodiment, the substrate is located on a substrate holder comprising an array of individually controllable heating and/or cooling elements arranged to provide the zone of temperature change. In an embodiment, the zone of temperature change is provided by localized application of heating or cooling to the layer by a heating or cooling source directed at the layer. In an embodiment, the heating and/or cooling source is a jet of gas. In an embodiment, the heating source is a beam of electromagnetic radiation. In an embodiment, the substrate is positioned in a chamber arranged to provide a temperature $T_i$ at the layer.

In an embodiment, there is provided a method for treatment of a layer at a surface of a substrate, the method comprising sequential heating or cooling of adjacent parts of the layer from an initial temperature, whereby a zone of temperature change is caused to sweep across at least a portion of the layer.

In an embodiment, there is provided a method for ordering and/or annealing of a self-assemblable polymer layer at a surface of a substrate, the method comprising sequential heating or cooling of adjacent parts of the layer from an initial temperature, whereby a zone of temperature change is caused to sweep across at least a portion of the layer.

In an embodiment, there is provided an apparatus comprising a substrate holder to hold a substrate having a layer at a surface, the apparatus arranged to provide a zone of temperature change at the layer and to sweep the zone across at least a portion of the layer, wherein the zone has a temperature profile across the width of the zone such that a temperature of the layer within the zone differs from an initial temperature for the layer within the zone prior to passage of the zone.

In an embodiment, the apparatus comprises a first chamber arranged to provide an initial temperature $T_i$ at the layer, a second chamber arranged to provide a temperature $T_f$ at the layer, an intermediate region between the first and second chambers, apertures between respective chambers arranged to permit passage of the substrate holder between the chambers through the intermediate region, and a conveyor arranged to move the substrate holder from a locus in the first chamber to a locus in the second chamber through the intermediate region, wherein the intermediate region is arranged to provide the zone of temperature change as the substrate holder carries the substrate therethrough. In an embodiment, the intermediate region is an intermediate chamber positioned between the first and second chambers and arranged to provide a temperature $T_z$ at the layer. In an embodiment, the substrate holder is arranged to hold the substrate in a chamber arranged to provide a temperature $T_i$ at the layer and wherein the apparatus further comprises a heating and/or cooling device arranged to provide the zone of temperature change. In an embodiment, the heating and/or cooling device comprises a nozzle configured to direct a gas jet onto the layer of the substrate during use. In an embodiment, the heating device comprises an outlet to provide a beam of electromagnetic radiation directed onto the substrate during use. In an embodiment, the beam of electromagnetic radiation is a laser beam. In an embodiment, the substrate holder comprises an array of individually operable heating and/or cooling members arranged to be in thermal contact with the substrate and arranged to provide the heating and/or cooling source.

In an embodiment, there is provided a lithography method for patterning a substrate surface by resist etching, wherein the method comprises treating a resist layer of self-assemblable polymer by a method as described herein.

In an embodiment, there is provided a lithography apparatus for patterning a substrate surface by etching of a resist layer incorporating an apparatus as described herein.

An embodiment of the present invention relates to lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. In particular, the methods and apparatus are suitable for high resolution lithography, where features patterned onto a substrate have a feature width or critical dimension of about 1 µm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is a significant consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layer forming part of the substrate, or being provided on a substrate, such as a planarization layers or anti-reflection coating layer.

While specific embodiments of the invention have been described above, it will be appreciated that the invention may be practiced otherwise than as described. For example, the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The invention claimed is:

1. A method for treatment of a layer comprising self-assemblable polymer self-assembled at a surface of a substrate, the method comprising arranging for a zone of temperature change to sweep across the layer, wherein a temperature of the layer within the zone differs from an initial temperature of the layer prior to passage of the zone and a temperature within the zone exceeds an order-disorder transition temperature To/d of the self-assemblable polymer.

2. The method of claim 1, wherein the layer has an initial temperature Ti before passage of the zone and wherein the zone has a temperature profile across the width of the zone such that a temperature of the layer within the zone differs from the initial temperature Ti.

3. The method of claim 2, wherein the layer has a final temperature Tf after passage of the zone and comprising returning the layer from its final temperature Tf to its initial temperature Ti after the arranging for a zone of temperature change to sweep across the layer, and subsequently repeating the arranging for a zone of temperature change to sweep across the layer.

4. The method of claim 2, wherein the layer has a final temperature Tf after passage of the zone and Tf and Ti are substantially the same.

5. The method of claim 2, wherein Ti is less than To/d.

6. The method of claim 2, wherein the layer has a final temperature Tf after passage of the zone and wherein Tf is less than To/d.

7. The method of claim 1, wherein the zone progresses in a sweep direction along which is measured a width of the zone, and the temperature profile is substantially uniform across the width of the zone, such that the layer within the zone has a temperature Tz.

8. The method of claim 1, wherein an initial temperature Ti of the layer before passage of the zone is less than a glass transition temperature Tg of the self-assemblable polymer.

9. The method of claim 1, wherein the zone is a substantially linear or annular strip and the zone sweeps across at least a portion of the layer in a direction substantially normal to the strip's length or perimeter respectively.

10. The method of claim 9, wherein the zone is an annular strip and the zone sweeps in a direction extending radially inwards to or outwards from a central locus.

11. The method of claim 1, wherein the substrate is arranged to move from a first region having a temperature Ti into a second region having a temperature Tf through an intermediate region arranged to provide the temperature profile of the zone, the zone sweeping across the layer as the substrate passes through the intermediate region.

12. The method of claim 11, wherein the first and second regions are chambers arranged to provide temperatures Ti and Tf respectively at the layer.

13. The method of claim 11, wherein the intermediate region is a chamber arranged to provide a controlled intermediate temperature Tz at the layer.

14. The method of claim 1, wherein the substrate is located on a substrate holder comprising an array of individually controllable heating and/or cooling elements arranged to provide the zone of temperature change.

15. The method of claim 1, comprising arranging for a plurality of separate zones of temperature change to sweep across the layer at any one time.

16. A method for ordering and/or annealing of a self-assemblable polymer layer at a surface of a substrate, the method comprising sequential heating or cooling of adjacent parts of the layer from an initial temperature, whereby a zone of temperature change is caused to sweep across at least a portion of the layer, wherein the zone is an annular strip and the zone sweeps in a direction extending radially inwards to or outwards from a central locus.

17. The method of claim 16, comprising sequential heating or cooling of adjacent parts of the layer from an initial temperature, whereby a plurality of zones of temperature change are caused to sweep across respective portion of the layer at any one time.

18. An apparatus comprising a substrate holder to hold a substrate having a layer at a surface, the apparatus arranged to provide a zone of temperature change at the layer and to sweep the zone across at least a portion of the layer, wherein the zone has a temperature profile across the width of the zone such that a temperature of the layer within the zone differs from an initial temperature for the layer within the zone prior to passage of the zone and wherein the zone is an annular strip and the zone sweeps in a direction extending radially inwards to or outwards from a central locus.

19. The apparatus of claim 18, wherein the substrate is located on a substrate holder comprising an array of individually controllable heating and/or cooling elements arranged to provide the zone of temperature change.

20. The apparatus of claim 18, wherein the apparatus is arranged to provide a plurality of separate zones of temperature change at the layer at any one time and to sweep the zones across respective portions of the layer.

\* \* \* \* \*